United States Patent
Eberhardt et al.

(10) Patent No.: US 7,167,003 B2
(45) Date of Patent: Jan. 23, 2007

(54) MEASURING METHOD OF SPATIALLY RESOLVED FREQUENCY SELECTIVE IMAGES

(75) Inventors: Kai Eberhardt, Zürich (CH); Michael Schär, Zürich (CH); Christoph Barmet, Zürich (CH); Peter Boesiger, Ennetbaden (CH); Sebastian Kozerke, Hedingen (CH)

(73) Assignees: Universitat Zurich, Zurich (CH); Eidgenossiche Technische Hochschule (E T H), Zurich (CH)

( * ) Notice: Subject to any disclaimer, the term of this patent is extended or adjusted under 35 U.S.C. 154(b) by 0 days.

(21) Appl. No.: 11/213,585

(22) Filed: Aug. 26, 2005

(65) Prior Publication Data
US 2006/0043971 A1 Mar. 2, 2006

(30) Foreign Application Priority Data
Aug. 28, 2004 (EP) .................................. 04020505

(51) Int. Cl.
*G01V 3/00* (2006.01)
(52) U.S. Cl. ...................................... 324/318; 324/309
(58) Field of Classification Search ................ 324/309, 324/307, 318, 319, 322, 300; 600/410, 412, 600/420–422
See application file for complete search history.

(56) References Cited

U.S. PATENT DOCUMENTS 4,707,658 A * 11/1987 Frahm et al. ................ 324/309
4,769,603 A * 9/1988 Oppelt et al. ................ 324/309
6,291,996 B1 * 9/2001 Glover et al. ................ 324/309

OTHER PUBLICATIONS

T.R. Brown et al. "NMR chemical shift imaging in three dimensions", Proc. Natl. Acad. Sci. USA, vol. 79, 3523-3526 (1982).
H.Y. Carr "Steady-state free precession in nuclear magnetic resonance", Physical Review, vol. 112, 1693-1701 (1958).
O. Speck, et al. "Fast $^{31}$P chemical shift imaging using SSFP methods", Magn. Reson. Med., vol. 48, 633-639 (2002).
W. Dreher, et al. "Fast proton spectroscopic imaging using steady-state free precession methods", Magn. Reson. Med., vol. 50, 453-460 (2003).
R. Freeman et al. "Phase amd intensity abnormalities in Fourier transform NMR" J. Magn. Res., vol. 4, 366-383 (1971).

* cited by examiner

*Primary Examiner*—Brij B. Shrivastav
(74) *Attorney, Agent, or Firm*—Cohen, Pontani, Lieberman & Pavane

(57) ABSTRACT

The present invention describes a magnetic resonance imaging method wherein spatially resolved frequency sensitive image data are collected by means of free precession sequences employing very small radio frequency (RF) excitation pulses per unit time which result in highly frequency selective steady-state signals dominated by linear properties of the system, for which the superposition principle holds. By appropriate linear combination of steady state signals of N different frequencies, N resonance lines can be acquired simultaneously. This method allows spectroscopic recordings with very low RF power deposition which renders the method suitable for applications at high static magnetic field strengths.

13 Claims, 8 Drawing Sheets

$$\alpha(t) = \alpha_0 \sum_{j=-20}^{20} \cos(\pi \cdot j \cdot t) \sum_{k=0}^{\infty} \delta(t - k \cdot TR)$$

$$a(t) = a_0 \sum_{k=0}^{\infty} \delta(t - k \cdot TR)$$

$$a(t) = a_0 \sum_{j=-2}^{2} \cos(2\pi \cdot j \cdot 7.5t) \sum_{k=0}^{\infty} \delta(t - k \cdot TR)$$

$$a(t) = a_0 \sum_{j=-6}^{6} \cos(2\pi \cdot j \cdot 7.5t) \sum_{k=0}^{\infty} \delta(t - k \cdot TR)$$

MEASURING METHOD OF SPATIALLY RESOLVED FREQUENCY SELECTIVE IMAGES

BACKGROUND OF THE INVENTION

The invention relates to spatially resolved spectroscopic recordings using nuclear magnetic resonance (NMR) methods. Such methods are known as chemical shift imaging (CSI) wherein nuclear spins are excited by means of radio frequency (RF) pulses and a signal thereof is recorded after a certain time during which spatial encoding of the signal by means of a gradient pulse in at least one spatial direction is imposed, wherein said gradient pulse is varied successively from one recording step to the next to encode spatial position of multiple measuring volumes. A method of this type is known e.g. from the publication by T. R. Brown et al. "NMR chemical shift imaging in three dimensions", Proc. Natl. Acad. Sci. USA, Vol. 79, 3523–3526 (1982).

In aforementioned method, excitation steps are repeated at a repetition time interval TR, wherein TR is typically chosen to be in the order of the longitudinal relaxation time T1, which is much longer than the time available for signal sampling which is given by the transversal relaxation time T2. Accordingly, these measuring schemes are time inefficient.

Steady state free precession (SSFP) techniques are known to be very efficient data sampling schemes with typical time intervals TR less than 1/100 of the relaxation time T1. These schemes were introduced to NMR long ago. Carr was the first to demonstrate the concept (H. T. Carr "Steady-state free precession in nuclear magnetic resonance", Physical Review, Vol. 112, 1693–1701 (1958)), but it only gained practical relevance with the availability of fast switching gradients. The frequency response in SSFP is periodic in frequency-space with 1/TR and shows wide regions of high signal, so-called pass-bands, and narrow regions of low signal which are referred to as dark-bands or stop-bands (FIG. 1). Accordingly, the TR is typically very short in the order of 2–10 ms to allow recordings over a frequency range of 100–500 Hz. The optimal excitation angle depends on T1 and T2 values but is typically in the order of 40 to 110 degrees. Variants of the SSFP method for spectroscopic recordings are described in U.S. Pat. No. 6,677,750 and U.S. Pat. No. 6,307,368. Other steady state spectroscopic imaging techniques have been proposed for water-fat separation, see: O. Speck, et al. "Fast 31P chemical shift imaging using SSFP methods", Magn. Reson. Med., Vol. 48, 633–639 (2002), and Dreher, et al. "Fast proton spectroscopic imaging using steady-state free precession methods", Magn. Reson. Med., Vol. 50, 453–460 (2003).

One practical drawback when applying short TR sequences relates to power deposition in the object, which is of particular relevance in the in-vivo application. The increase in power deposition with increasing field strength can be approximated to scale with the field strength squared.

SUMMARY OF THE INVENTION

It is an object of the present invention to avoid the drawbacks mentioned above. For this purpose, the method according to the invention exploits the response of SSFP sequences at small flip angles. Utilizing small flip angles overcomes limitations due to power deposition associated with conventional SSFP methods.

In conventional SSFP high signal is generated over a large frequency range. So-called dark-bands with total signal loss are interspersed every 1/TR with TR being the repetition interval in-between successive RF excitations. Such an excitation regime will be denoted strong excitation regime hereafter. At small excitations, the signal relationships are reversed. The signal level of the high signal pass-bands becomes very low and strong signal arises from the narrow frequency range of the dark-bands. Such a regime will be referred to as weak excitation regime hereafter. The occurrence of high signal levels from the dark-bands has been noted elsewhere (R. Freeman et al. "Phase and intensity abnormalities in Fourier transform NMR" J. Magn. Res., Vol. 4, 366–383 (1971)), but has not been utilized for imaging nor has it been treated in greater detail.

The excitation of an ensemble of spins by a sequence of RF-pulses may be described by a rotation rate $\bar{\omega}_\alpha$ which is defined as the sum of the applied flip angles α per unit time. The weak excitation regime is defined as the excitation regime that generates optimal signal strength from the dark-band; expressed in units of radians per unit time, it is given by a rotation rate of:

$$\bar{\omega}_\alpha = \frac{1}{\sqrt{T_1 T_2}}$$

wherein T1 and T2 denote longitudinal and transversal relaxation times, respectively. For typical relaxation times T1 of 3000 to 500 milliseconds and T2 of 1000 to 20 milliseconds, optimum signal from the dark-band is obtained for a rotation rate of 10 to 500 degrees per second. In practice, small variations from the optimum for dark-band excitation as defined above may be used to produce different contrasts in the imaged object. Typically, rotation rates of up to about twice the above mentioned limit are found to be useful.

The steady-state signal resulting from weak excitation is dominated by the characteristics of the first linear approximation to the response of the system. As in the linear approximation the superposition principle holds, it is possible to generate a plurality of the above described dark-bands with strong signal by using appropriate linear combinations of weak excitations. Such excitation schemes generally consist of a rapid sequence of RF pulses with predefined individual phases and excitation angles according to a well ordered fashion, with NMR signal being acquired between excitation pulses.

According to the present invention, a method of magnetic resonance (NMR) for collecting frequency sensitive image data is provided. The method comprises the steps of:

a) applying, to an object in a magnetic field, a sequence of radio frequency (RF) pulses, the effect of said sequence on a spin ensemble of said object being characterized by a flip function $\omega_{\alpha\beta}(t)$, said flip function being represented as a Fourier series of frequency components $$\omega_{\alpha\beta}(t) = \sum_{j=-(m-1)/2}^{(m-1)/2} \omega_j e^{\left(i\frac{2\pi}{T_S}jt\right)}$$

wherein j is an integer running index, m is an integer denoting the number of frequency components of said Fourier series, i is the imaginary unit, t is time, $T_s$ is the periodicity of said flip function and $\omega_j$ is the rotation rate associated with the j-th frequency component, the pulses being chosen such that each one of said rotation rates $\omega_j$ is constrained not to exceed an upper limit given substantially by $$\omega_{max} = \frac{2}{\sqrt{T_1 T_2}}$$

wherein T1 and T2 are the longitudinal and transversal relaxation time, respectively, of said ensemble;

b) applying magnetic gradient fields to encode spatial position along at least one spatial dimension;

c) recording NMR signal during a signal recording time between excitation pulses.

Preferably, in accordance with the principle of balanced SSFP, the action integral over the gradient strength between two excitations is zero. By acquiring and combining the complex weighted k-space data or images, a spectrally selective image can be generated.

In a particularly preferred variant of the concept described above one or more excitations with a constant repetition time, linearly increased phase and corresponding constant frequency and constant but possibly different excitation level are linearly combined. At the low excitation level this will produce a series of excitations at the frequencies of the superposed excitations. These single, spectrally localized signals can be separated by linear combination of the complex weighted k-space data or images.

A particularly preferred version of the above is when the N excitations all have the same excitation level and a set of equidistant frequencies are superposed to create selective images from a band of frequencies. Frequencies outside of this band will be suppressed and the excitation of only a band of frequencies facilitates a more rapid measurement as fewer signals need to be recombined to reconstruct the spectrally selective image at a given spectral resolution. The single resonances then can be separated by a discrete Fourier transform.

In a further preferred variant, switching of a magnetic gradient field spatially limits the excitation volume simultaneously with irradiation of the exciting RF pulses. This facilitates precise limitation of the NMR measurement to certain parts of the measuring object thereby.

In a further preferred variant the action integral over the gradient between excitations is not zero, but a constant value per time between two excitations. Thereby a frequency axis is mapped onto the direction of the integral over the gradient and the resonances will occur in both the frequency and the spatial dimension. Repeating the experiment with different gradient per time unit remainder allows for spatial encoding and generation of images thereby.

In a further preferred variant the same experiment is repeated several times with different scaling of excitation to generate different contrast. From these images a characterization of the relaxation parameters and spin densities is possible with this invention.

Possible applications include but are not limited to phosphorous spectroscopic imaging, lipid spectroscopic imaging, B0 characterizations, microscopy and quantification of relaxation rates and spin density.

The invention also relates to a magnetic resonance imaging system. It is a further object of the invention to provide a magnetic resonance imaging system for carrying out the magnetic resonance imaging methods according to the invention. The functions of a magnetic resonance imaging system according to the invention are preferably carried out by means of a suitably programmed computer or (micro) processor or by means of a special purpose processor provided with integrated electronic or opto-electronic circuits especially designed for the execution of one or more of the magnetic resonance imaging methods according to the invention.

The invention furthermore relates to a computer program with instructions for executing a magnetic resonance imaging method. It is thus a further object of the invention to provide a computer program whereby one or more of the magnetic resonance imaging methods according to the invention can be carried out. When such a computer program according to the invention is loaded into the computer of a magnetic resonance imaging system, the magnetic resonance imaging system will be capable of executing one or more magnetic resonance imaging methods according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by means of a CD-ROM player, and by storing the computer program in the memory of the computer of the magnetic resonance imaging system.

The invention and the objects and features thereof will be more readily apparent from the following detailed description and claims when taken with the drawings.

The features mentioned above and below can be used with the invention either individually or collectively in any arbitrary combination. The embodiments shown and described are not to be understood as exhaustive enumeration but rather have exemplary character for describing the invention.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein:

FIG. 1 shows excitation profiles with T1=2 s, T2=0.5 s, for the following conditions:

$$\alpha(t) = \alpha_0 \sum_{k=0}^{\infty} \delta(t - k \cdot TR)$$

Figure 4A:
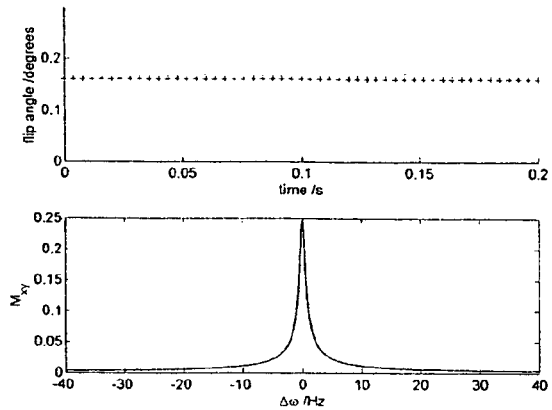
FIG. 4a: single peak excitation ($\alpha_0=0.16°$)
Figure 4B:
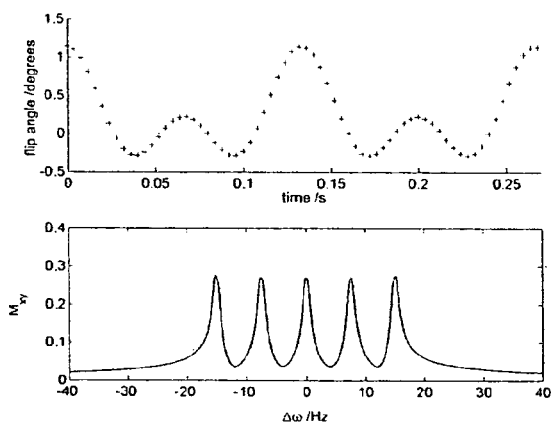
FIG. 4 shows the application of the superposition principle by displaying flip angle functions (upper rows) and corresponding excitation profiles (lower rows), with peaks occurring at the frequencies of the flip angle function, with parameters T1=2 s, T2=0.5 s, TR=4 ms and the following excitation types.

FIG. 4b: multiple peak excitation ($\alpha_0=0.16°$):

$$\alpha(t) = \alpha_0 \sum_{j=-2}^{2} \cos(2\pi \cdot j \cdot 7.5t) \sum_{k=0}^{\infty} \delta(t - k \cdot TR)$$

Figure 4C:
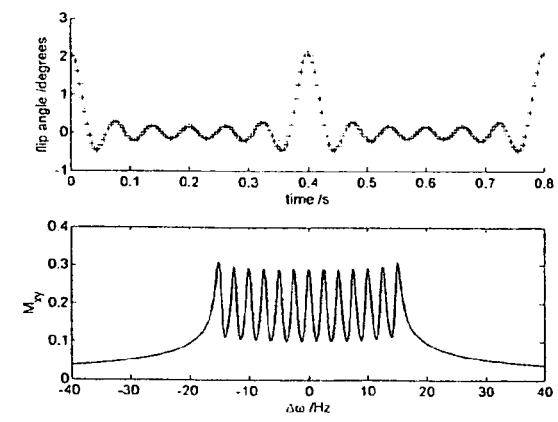

FIG. 4c: multiple peak excitation ($\alpha_0=0.11°$):

$$\alpha(t) = \alpha_0 \sum_{j=-6}^{6} \cos(2\pi \cdot j \cdot 7.5t) \sum_{k=0}^{\infty} \delta(t - k \cdot TR)$$

Figure 5:
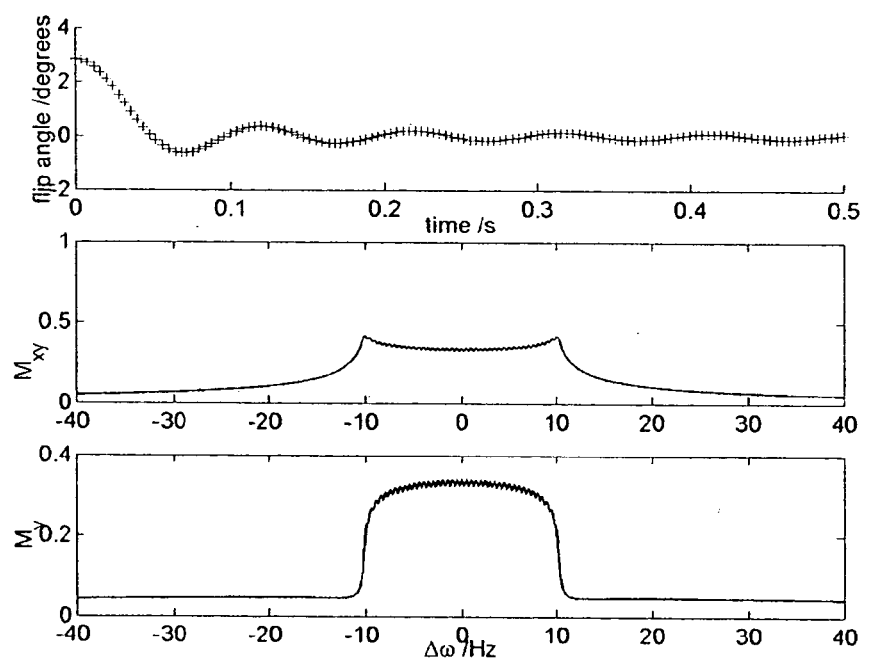

FIG. 5 shows the application of the superposition principle for the excitation of a band of frequencies by displaying the flip angle function (upper row), the magnitude of transverse magnetization (middle row) and the magnetization in y-direction (lower row) for $\alpha_0=0.07°$ at TE=TR/2 in the state reached after 4 seconds.

Figure 6:
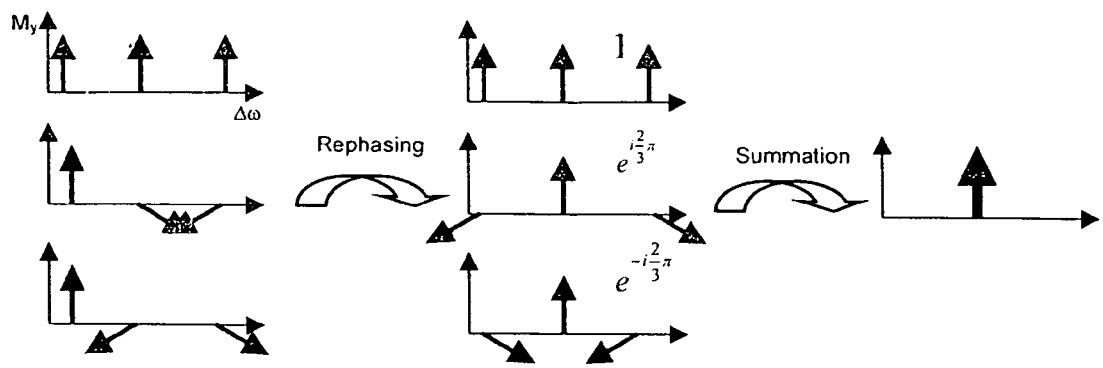

FIG. 6 illustrates the principle of spectral slicing. The three peaks excited in the frequency response function can be resolved via shifting the phases and summing the images. The linear combination of the N acquired images can be used to reconstruct N excited peaks. This is especially easy to achieve if N equidistant peaks are excited, then the reconstruction algorithm is a discrete Fourier transform.

Figure 7:
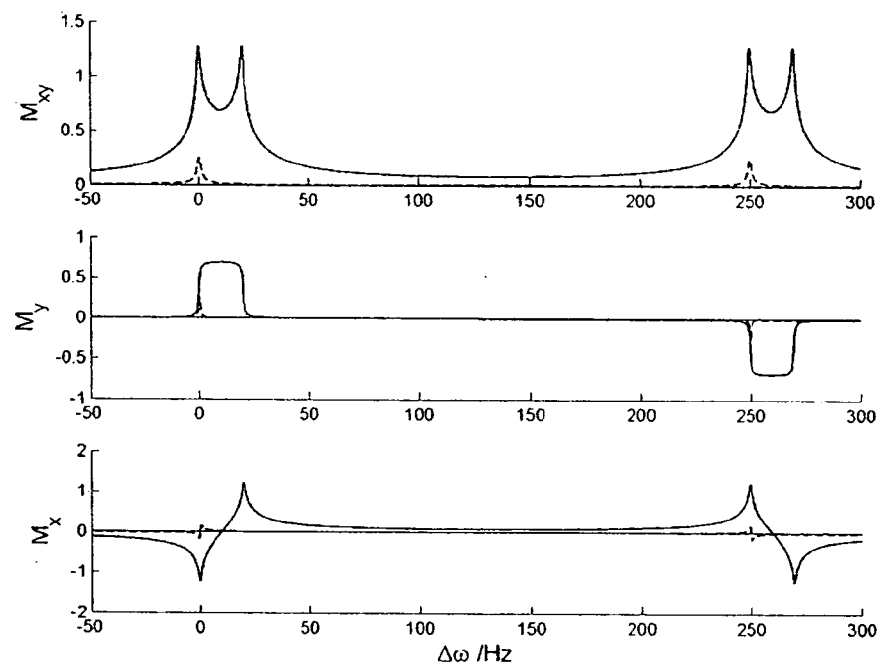

FIG. 7 shows as a solid line the superposition of frequency profiles of 40 measurements at a distance of 0.5 Hz, with parameters: T1=2 s, T2=0.5 s, TR=4 ms, TE=2 ms; the dashed line represents a single measurement.

Figure 8A:
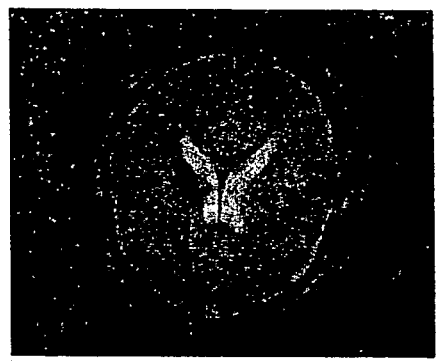
Figure 8B:
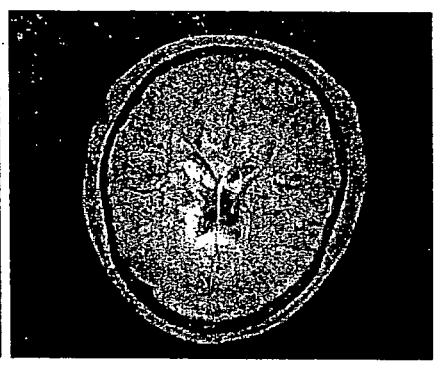
Figure 8C:
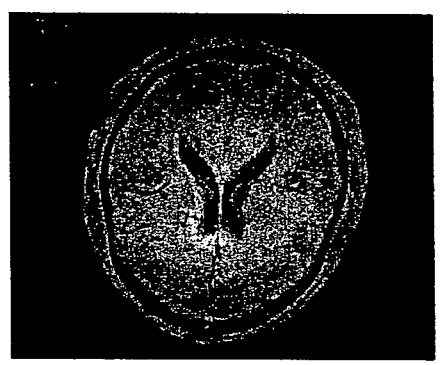
Figure 8D:
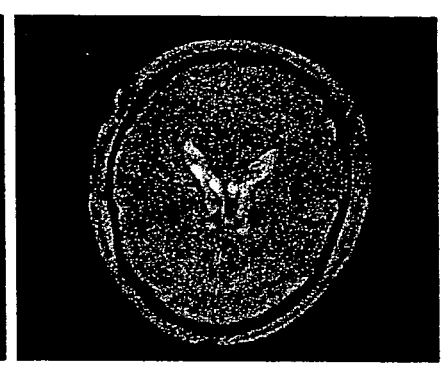

FIG. 8 shows proton images of a human brain at 3 T. The images were reconstructed by superposing 30 images acquired with a constant flip angle pulse sequence ($\alpha=1.1°$, TR=4.7 ms, FOV: 230×192×230 mm$^3$, matrix: 256×256×32, acquisition time per image: 50 s, SAR<50 mW/kg), whereby the frequency offset of the RF pulse train was 2 Hz between two consecutive images:

FIG. 8a: sum of absolute values;

FIG. 8b: absolute value of summed complex data;

FIG. 8c: imaginary component of summed complex data;

FIG. 8d: real component of summed complex data.

Figure 9:
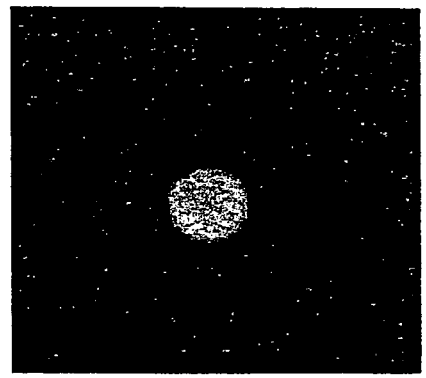

FIG. 9 shows phosphorous ($^{31}$P) images of a spherical phantom filled with H$_3$PO$_4$ acid at 1.5 T. Ten images at a distance of 1 Hz were used to reconstruct the sphere. Parameters: TR 8 ms, matrix 256×256×32, FOV 200×200× 256 mm$^3$, acquisition time per image 31 s.

Figure 10A:
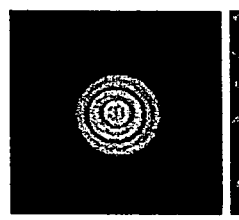
Figure 10B:
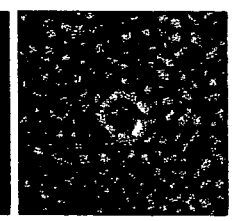
Figure 10C:
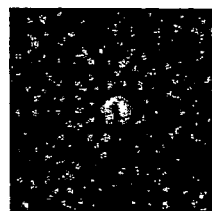
Figure 10D:
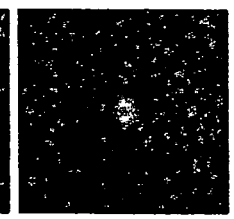

FIG. 10 shows measurements of a spherical compartment phantom; all images were zero-filled to obtained 128×128 matrices:

FIG. 10a shows a $^1$H-SSFP image of the phantom;

FIG. 10b shows a $^{31}$P-SSFP image of the surrounding cylinder of the phantom;

FIG. 10c shows a $^{31}$P-SSFP image of the inner sphere of the phantom;

FIG. 10d shows a dark-band-SSFP $^{31}$P-image, sum of 10 images acquired with 1 Hz steps.

FIG. 11 shows images of a spherical compartment phantom. The inner sphere is embedded in water and contains a 100 mmol/l solution of creatine. 10 images, each with an acquisition time of 70 seconds at a distance of 1 Hz were summed to reconstruct the sphere. TR=2.17 ms, TE=TR/2, acquired matrix 64×64, zero-filled to 128×128.

Figure 12:
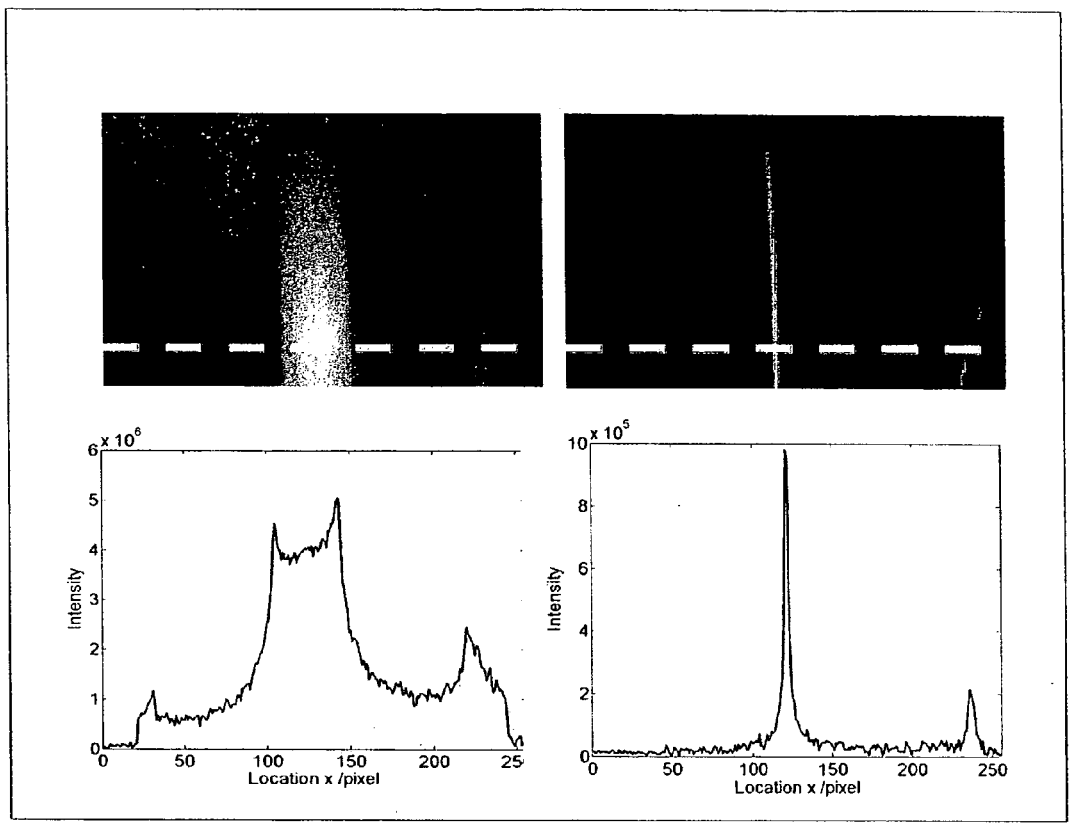

FIG. 12 shows a phantom experiment comprising excitation of 51 peaks in a spectrum, wherein each peak can be reconstructed separately. The measurement was performed in a spherical water phantom with a gradient field along one axis to simulate a frequency range. The upper left image shows the absolute value of the sum of all peaks. The upper right image shows the 23rd peak illustrating the capability to resolve small spectral ranges. The bottom figures show corresponding intensity profiles along the dashed line as indicated.

DETAILED DESCRIPTION OF THE INVENTION

The exemplifications set out herein are not to be construed as limiting the scope of this disclosure or the scope of this invention in any manner.

Figure 2:
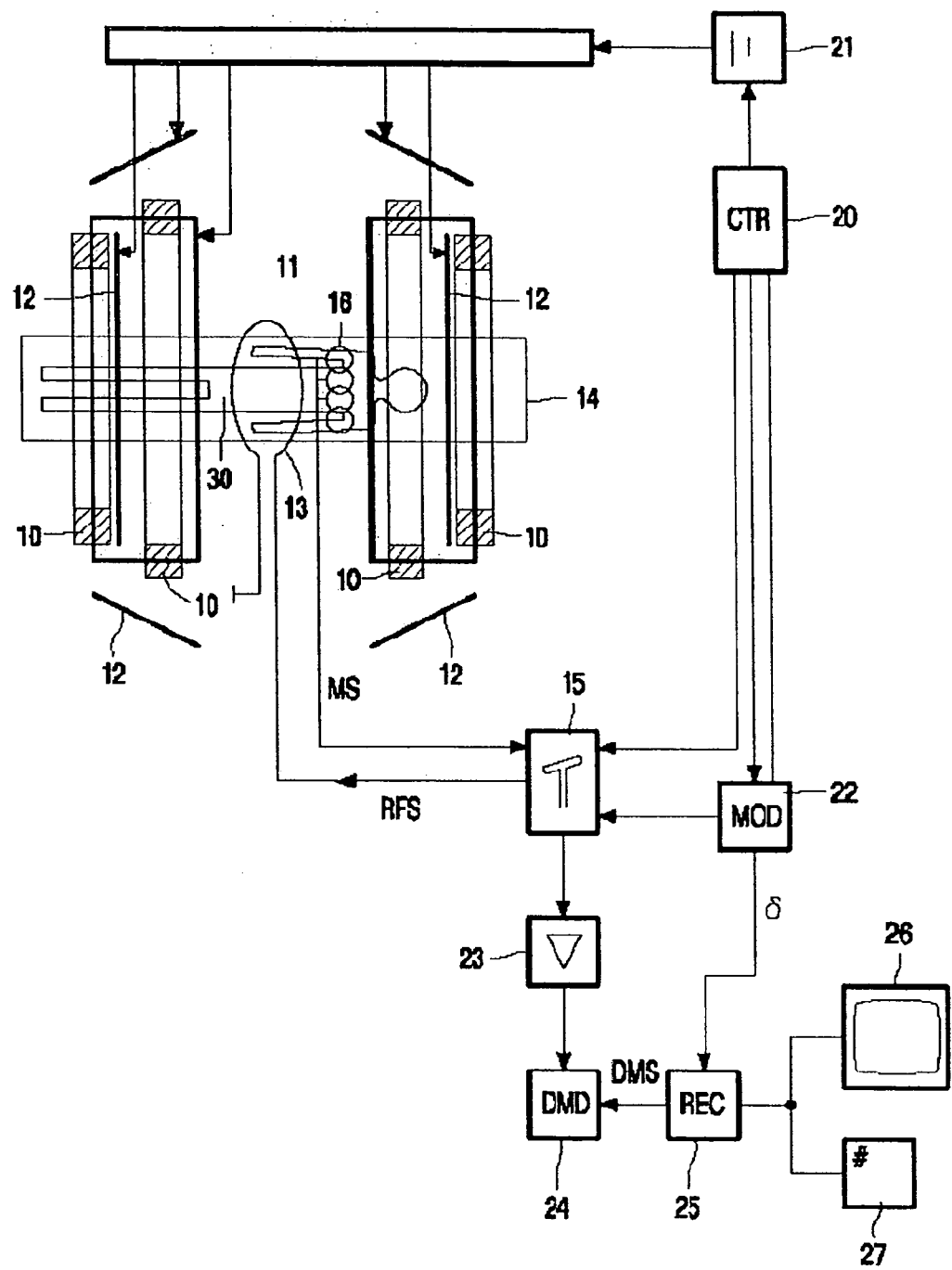
FIG. 2 shows a schematic representation of an apparatus for measuring spatially resolved frequency selective images by means of nuclear magnetic resonance.

The nuclear magnetic resonance imaging system shown in FIG. 2 includes a set of main coils 10 whereby a steady, spatially uniform magnetic field is generated. The main coils are constructed, for example, in such a manner that they enclose a tunnel-shaped examination space. A patient to be examined is slid on a table into this tunnel-shaped examination space.

The magnetic resonance imaging system also includes a number of gradient coils 12, whereby magnetic fields exhibiting spatial variations, notably in the form of temporary gradients in individual directions, are generated so as to be superposed on the uniform magnetic field. The gradient coils 12 are connected to a controllable power supply unit 21. The gradient coils 12 are energized by application of an electric current by means of the power supply unit 21. The strength, direction and duration of the gradients are controlled by control of the power supply unit.

The magnetic resonance imaging system further includes transmission and receiving coils 13, 16 for generating RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 16 are preferably surface coils that are arranged on or near the body of the patient 30 to be examined. Such surface coils 16 have a high sensitivity for the reception of magnetic resonance signals which is also spatially inhomogeneous. This means that individual surface coils 16 are mainly sensitive for magnetic resonance signals originating from specific directions, i.e. from specific parts of the patient's body. The coil sensitivity profile represents the spatial sensitivity of the set of surface coils.

The transmission coils, notably surface coils, are connected to a demodulator 24 and the received magnetic resonance signals (MS) are demodulated by means of the demodulator 24. The demodulated magnetic resonance signals (DMS) are applied to a reconstruction unit 25. The reconstruction unit reconstructs the magnetic resonance image from the demodulated magnetic resonance signals (DMS) and optionally on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image.

The reconstruction unit 25 is preferably constructed as a digital image processing unit 25 which is programmed so as to reconstruct the magnetic resonance image from the demodulated magnetic resonance signals and optionally on the basis of the coil sensitivity profile. The digital image processing unit 25 is notably programmed so as to execute the reconstruction in conformity with the present invention. The image signal from the reconstruction unit is applied to a monitor 26 so that the monitor can display the image information of the magnetic resonance image (images). It is also possible to store the image signal in a buffer unit 27 while awaiting further processing.

In order to form a magnetic resonance image or a series of successive magnetic resonance images of an object, notably a patient or other body to be examined, the body is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply an RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger man such a thin slice; for example, the spins can be excited in a three-dimensional part which extends substantially in three directions in the body.

After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k-space is scanned by the magnetic resonance signals by application of the read-out gradients and the phase encoding gradients.

The invention relies on a pulse technique which drives spins into a steady-state by weak excitation. The signal of this steady-state is frequency selective with bandwidths on the order of 1/T2 and is dominated by the linear approximation to the Bloch equations for which the superposition principle holds. The desired frequency response can thus be generated by appropriate linear combinations of multiple steady-state signals.

Low and High Excitation Level: Continuous Excitation

Figure 1A:
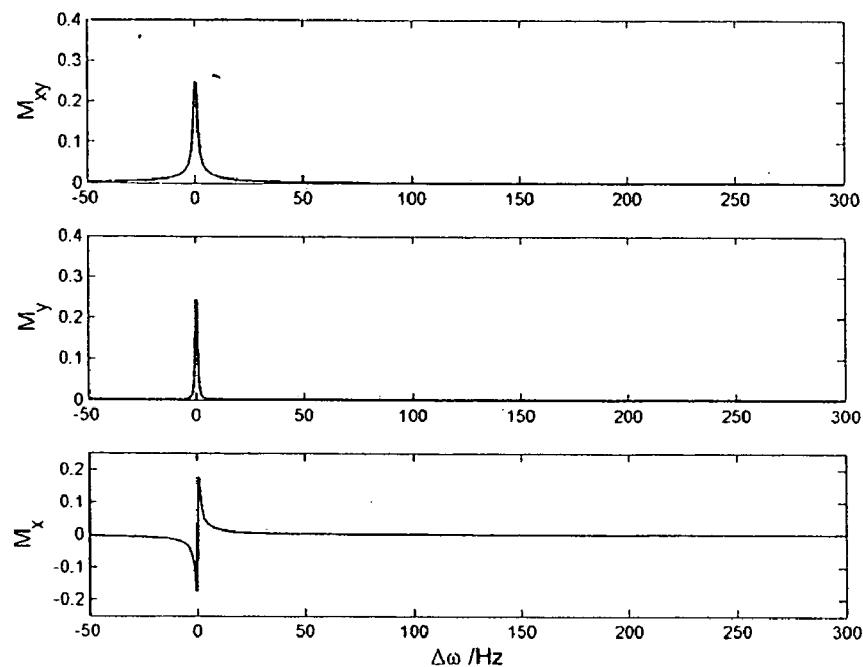
FIG. 1a: continuous weak excitation, 57.3°/s.
Figure 1B:
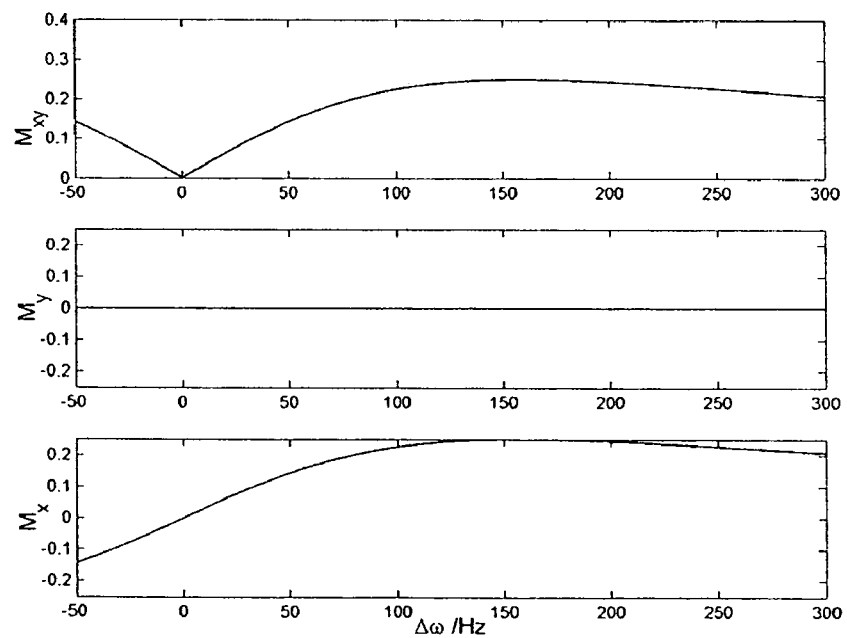
FIG. 1b: continuous strong excitation, 28650°/s.

At infinitely long excitation at a single frequency about the x axis of the rotating frame, spins will no longer precess about the field but stay locked in a new equilibrium position. There are two different boundary cases of excitation to discern. If the excitation is weak compared to the relaxation, the response of the system is given by a Lorentzian peak in the y-direction with a dispersive component in the x-direction (FIG. 1a). With very strong excitation, the peak will saturate and disappear in the transient state, while the dispersive component will expand to higher frequencies and become step-function like around the excitation frequency, with the transversal signal directed towards the rotation axis about which the excitation is applied in the rotating frame (FIG. 1b). While the weak excitation generates signal from a small spectral region, the signal from the strong excitation is from everywhere but at the excitation frequency. The narrow band around the excitation frequency is referred to as the dark-band.

Low and High Excitation Level: Pulse Sequences

Figure 1C:
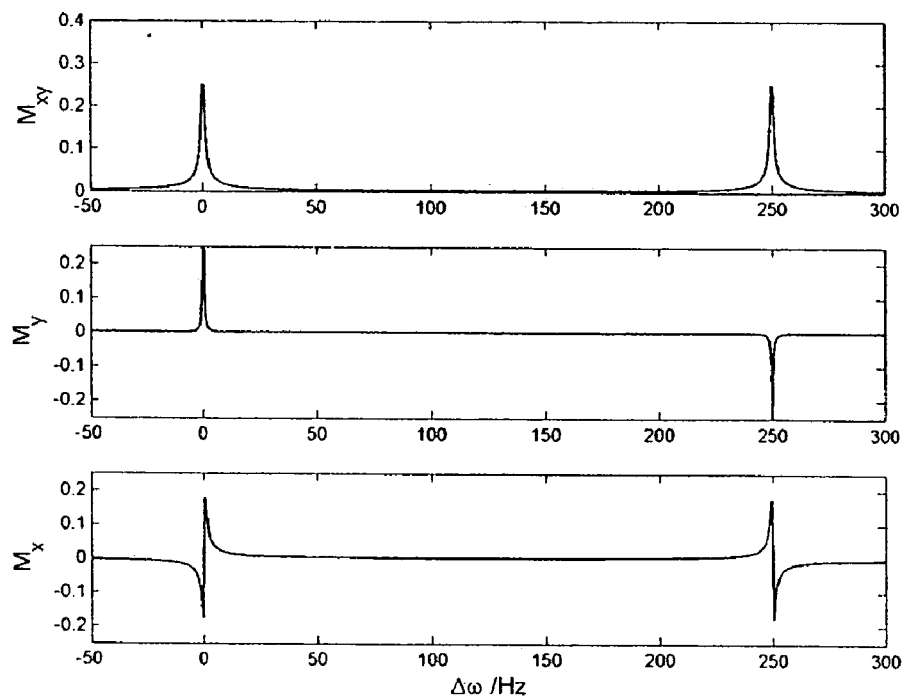
FIG. 1c: "dark-band" SSFP (optimal dark-band flip angle: 0.23°, TR=4 ms)
Figure 1D:
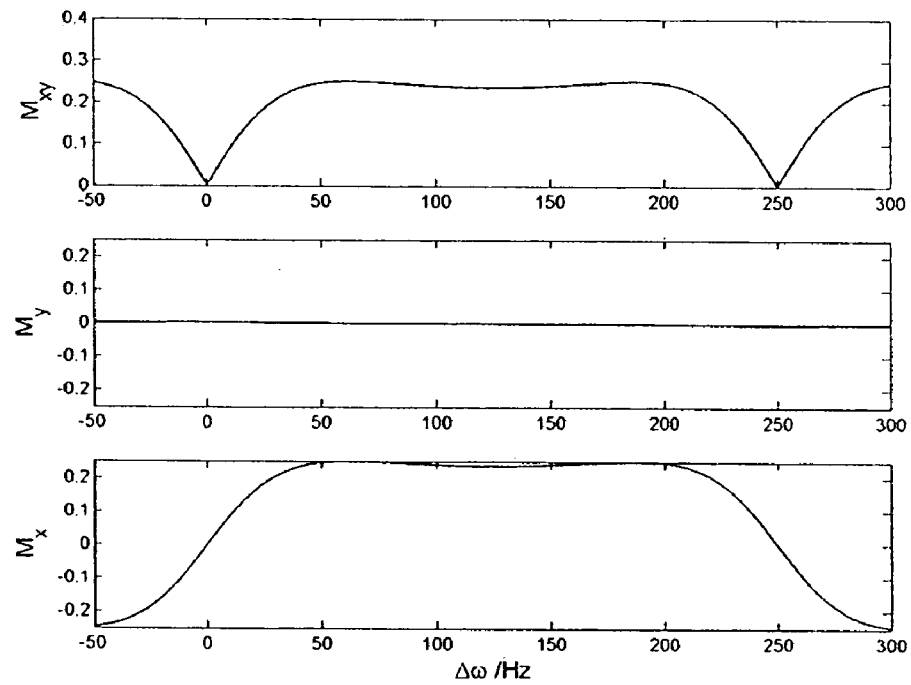
FIG. 1d: "conventional (prior art)" SSFP (optimal SSFP flip angle: 39°, TR=4 ms).

If one replaces the continuous excitation with a hard pulse repeated every TR, these pulses in themselves have no inherent frequency, but only their phase, being applied about the x-axis. This means that two spins with resonance frequencies separated by 1/TR will show the same behavior. Therefore in the weak excitation case the frequency response will be a comb of peaks separated by 1/TR (FIG. 1c). The response in the strong excitation case will show the standard SSFP-characteristics of wide pass-bands of high signal and narrow stop-bands or dark-bands where the magnetization is dispersed, periodic with 1/TR in the frequency domain at the echo time of TR/2 after a pulse (FIG. 1d). As the integral over the gradients is zero over one TR, the excitation is unaffected by a readout period between pulses.

Superposition Principle

The basic function of continuous excitation is $\omega(t) = \omega_0 e^{-i2\pi\nu t}$ where $\nu$ is the frequency of the excited spin and $\omega_0$ is a complex constant. If one applies the excitation in a block-pulse fashion this becomes $$\omega(t) = \omega_0 e^{-i2\pi\nu t} \sum_{k=0}^{\infty} \delta(t - k \cdot TR)$$

with the repetition time TR and delta-function $\delta$. The response of the system differs in that an aliasing effect occurs with the frequency response being periodic with 1/TR. Several peaks can be excited simultaneously by summing their respective excitations $\omega_1(t) = \omega_1 e^{-i2\pi\nu_1 t}$, $\omega_2(t) = \omega_2 e^{-i2\pi\nu_2 t}$ to $\omega(t) = \omega_1(t) + \omega_2(t)$ or the corresponding function convoluted by a delta-train for discrete excitation. FIGS. 4a–c demonstrate this principle. It is important to note that the frequency response will not be approximately constant as in SSFP with only minor developments over the sequence repetition time TR. In this case, not the pulse repetition time TR, but the sequence repetition time $T_s$ is the periodicity of the response. $T_s$ is determined by the inverse of the smallest common multiple of all the frequencies of excitation in the continuous excitation case. For the pulsed excitation this is principally the same just that the finite "sampling rate" of TR sets an upper band limit to the excitation (Nyquist criterion).

Perturbation Solution

The first order perturbation solution of the Bloch equations in complex notation is given by:

$$M_{xy}^{(1)}(t) = M_0 \sum_\Omega \frac{-i\omega_\Omega}{i\Omega - a}\left(e^{i\Omega t} - e^{\left(-\frac{1}{T_2} + \Delta\omega\right)t}\right)$$

$$M_z^{(1)}(t) = M_0$$

with $$\omega(t) = \sum_\Omega \omega_\Omega e^{\Omega t}$$

the Fourier series of the excitation and the equilibrium position of the system $M(t=0)=(0\ 0\ M_)^T$. The second order in $M_{xy}$ is zero and the third orders include the effects in $M_{xy}$ of saturation in z-direction. In the equation above two signal components can be characterized. The first exponential is the steady-state response and the second is the exponentially decaying and oscillating component of the transient response.

The superposition principle holds in the linear order. Higher order components will not retain this characteristic, but the linear solution approximates the low excitation regime well.

In a preferred version, this excitation can be used to excite a band of frequencies (FIG. 5). This allows spectroscopic imaging at high signal levels and simultaneous reduced acquisition time at a given resolution.

Convolution

By restricting the excitation to block pulses at a constant repetition rate, an acquisition time TA<TR can be used to sample data. If the data is acquired with additional gradients these should be refocused over TR. If one calculates the convolution the effect is that in the frequency-space of the excitation:

$$\omega_{\alpha\beta}(t) = \omega(t) \sum_{k=-\infty}^{\infty} \delta(t - kTR)$$

Is equivalent to $$\omega_{\alpha\beta}(t) = \sum_{k=-\infty}^{+\infty} \omega_k e^{ik\Omega t} = \sum_{j=-n}^{n}\left(\sum_{j=k\,mod\,n} w_k\right)e^{ij\Omega t}$$

with $$\Omega = \frac{2\pi}{T_S},$$

where $T_s$ is the periodicity of the flip-function. This is an effect of the finite constant "sampling" of the flip-function by pulses. Two effects are that the response of the spin-system is periodic with 1/TR and frequencies $$\nu = \frac{k}{T_S}$$

with k=k' mod n cannot be seen separately by the spins (Nyquist criterion). The echo time can be chosen such that a band of frequencies between peaks is directed orthogonally to the rest, allowing a better separation and spectral localization of the signal.

Acquisition—Discrete Fourier Transformation

If the first order solution for the transverse magnetization is discretely sampled N times within $T_S$, it is possible to resolve N equidistant neighboring peaks via a discrete Fourier transform.

$$\sum_{n=0}^{N-1} M_{xy}(t_n) e^{-i2\pi\frac{n}{N}k} = \sum_{j=0}^{N-1} C_j e^{i\varphi_j} \sum_{n=0}^{N-1} e^{i2\pi\frac{n}{N}(j-k)}$$

$$= \sum_{j=0}^{N-1} C_j e^{i\varphi_j} N \delta_{jk}$$

$$= N C_k e^{i\varphi_k}$$

with $C_\Omega = \dfrac{-iw_{\alpha\beta\Omega}}{\dfrac{1}{T_2} + i(\Omega - \Delta\omega)}.$ Maximally $T_S/TR=N$ peaks can be detected over the frequency field-of-view. If one only excites a portion c(m=N/c neighboring peaks), the reconstruction of the peaks is also possible in a simple manner.

The single Lorentzian peaks in the frequency domain can be resolved by the following transformation using a set of k-space data n+kc, with k=0, 1, . . . m-1:

$$\sum_{k=0}^{m-1} e^{i2\pi b\frac{n+kc}{N}} e^{-i2\pi a\frac{kc}{N}} = e^{i2\pi\frac{n}{N}} \sum_{k=0}^{m-1} e^{i2\pi\frac{kc}{N}(b-a)}$$

$$= e^{i2\pi\frac{n}{N}} \sum_{k=0}^{m-1} e^{i2\pi\frac{k}{m}(b-a)}$$

$$= m\delta_{0,(b-a)\,mod\,m}$$

$$= m\delta_{a,b}$$

Thus $$\sum_{k=0}^{m-1} M_{xy}(t_n) e^{-i2\pi\frac{n}{N}k} = \sum_{j=0}^{m-1} C_j e^{i\varphi_j} \sum_{k=0}^{m-1} e^{i2\pi\frac{n}{N}(j-k)}$$

$$= \sum_{j=0}^{m-1} C_j e^{i\varphi_j} m \delta_{jk}$$

$$= m C_k e^{i\varphi_k}$$

This allows one to select only a spectral "slice" of interest and trading the rest of the data for acquisition speed without any loss of spectral resolution (FIG. 6).

Figure 3:
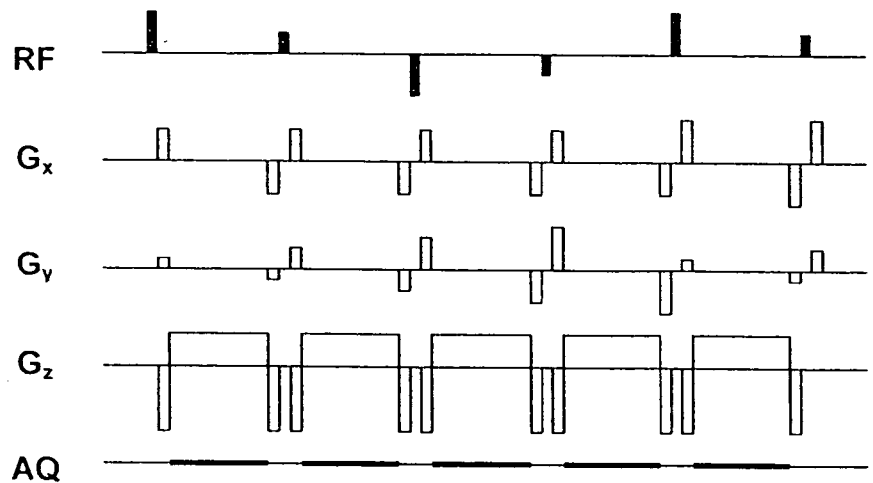
FIG. 3 shows an exemplary pulse sequence with phase encoding in x- and y-direction, direction, readout in z-direction and varying excitation angle.

FIG. 3 shows an exemplary pulse sequence with phase encoding in x- and y-direction, readout in z-direction and varying excitation angle.

FIG. 6 illustrates the principle of spectral slicing. The three peaks excited in the frequency response function can be resolved via shifting the phases and summing the images. The linear combination of the N acquired images can be used to reconstruct N excited peaks. This is especially easy to achieve if N equidistant peaks are excited, then the reconstruction algorithm is a discrete Fourier transform.

FIG. 7 shows as a solid line the superposition of frequency profiles of 40 measurements at a distance of 0.5 Hz, with parameters: T1=2 s, T2=0.5 s, TR=4 ms, TE=2 ms; the dashed line represents a single measurement.

FIG. 12 shows a phantom experiment comprising excitation of 51 peaks in a spectrum, wherein each peak can be reconstructed separately. The measurement was performed in a spherical water phantom with a gradient field along one axis to simulate a frequency range. The upper left image shows the absolute value of the sum of all peaks. The upper right image shows the 23rd peak illustrating the capability to resolve small spectral ranges. The bottom figures show corresponding intensity profiles along the dashed line as indicated.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

FIGS. 8a–d show proton images of a human brain at 3 T. The images were reconstructed by superposing 30 images acquired with a constant flip angle pulse sequence ($\alpha$=1.1°, TR=4.7 ms, FOV: 230×192×230 mm$^3$, matrix: 256×256×32, acquisition time per image: 50 s, SAR<50 mW/kg), whereby the frequency offset of the RF pulse train was 2 Hz between two consecutive images. FIG. 8a shows an image reconstructed using sum of absolute values, FIG. 8b shows an image reconstructed using absolute value of summed complex data, FIG. 8c shows an image reconstructed using imaginary component of summed complex data, and FIG. 8d shows an image reconstructed using real component of summed complex data.

FIG. 9 shows phosphorous ($^{31}$P) images of a spherical phantom filled with H$_3$PO$_4$ acid at 1.5 T. Ten images at a distance of 1 Hz were used to reconstruct the sphere. Parameters: TR 8 ms, matrix 256×256×32, FOV 200×200×256 mm$^3$, acquisition time per image 31 s.

FIGS. 10a–d show measurements of a spherical compartment phantom; all images were zero-filled to obtained 128×128 matrices, wherein FIG. 10a shows a $^1$H-SSFP image of the phantom, FIG. 10b shows a $^{31}$P-SSFP image of the surrounding cylinder of the phantom, FIG. 10c shows a $^{31}$P-SSFP image of the inner sphere of the phantom; and FIG. 10d shows a dark-band-SSFP $^{31}$P-image, sum of 10 images acquired with 1 Hz steps.

Figure 11A:
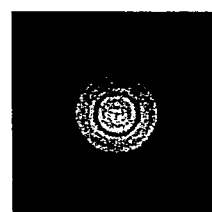
Figure 11B:
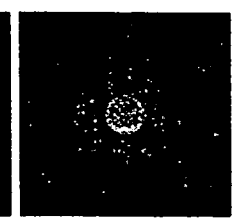

FIGS. 11a–b show images of a spherical compartment phantom. The inner sphere is embedded in water and contains a 100 mmol/l solution of creatine. FIG. 11a shows a standard $^1$H-SSFP image of the phantom. FIG. 11b is a dark-band-SSFP $^1$H image obtained as the sum of 10 images, each with an acquisition time of 70 seconds at a distance of 1 Hz, which were summed to reconstruct the sphere. TR=2.17 ms, TE=TR/2, acquired matrix 64×64, zero-filled to 128×128.

The invention claimed is:

1. A method of magnetic resonance (NMR) for collecting frequency sensitive image data, the method comprising the steps of:
   a) applying, to an object in a magnetic field, a sequence of radio frequency (RF) excitation pulses, the effect of said sequence on a spin ensemble of said object being characterized by a flip function $\omega_{\alpha\beta}(t)$, said flip function being represented as a Fourier series of frequency components $$\omega_{\alpha\beta}(t) = \sum_{j=-(m-1)/2}^{(m-1)/2} \omega_j e^{\left(i\frac{2\pi}{T_S}jt\right)}$$

wherein j is an integer running index, m is an integer denoting the number of frequency components of said Fourier series, i is the imaginary unit, t is time, $T_s$ is the periodicity of said flip function and $\omega_j$ is the rotation rate associated with the j-th frequency component, the pulses being chosen such that each one of said rotation rates $\omega_j$ is constrained not to exceed an upper limit given substantially by $$\omega_{max} = \frac{2}{\sqrt{T_1 T_2}}$$

wherein T1 and T2 are the longitudinal and transversal relaxation time, respectively, of said ensemble;
   b) applying magnetic gradient fields to encode spatial position along at least one spatial dimension;
   c) recording NMR signal during a signal recording time between excitation pulses.

2. The method as defined in claim 1, wherein the integral of the magnetic gradient fields is zero over a temporal length such that the NMR signals are generated according to the principle of balanced steady-state free precession (SSFP).

3. The method as defined in claim 1, wherein step a) includes switching of magnetic gradient fields during the RF pulses, whereby excitation of the spins is constrained to a limited volume.

4. The method as defined in claim 1, wherein a plurality of different datasets are acquired and recombined by complex weighting to obtain spectrally selective data.

5. The method as defined in claim 1, wherein a plurality of images of small spectral regions are obtained and recombined by summing either the magnitudes or the complex weighted datasets.

6. The method as defined in claim 4, wherein excitation is limited to a predefined spectral interval so as to achieve a comparatively higher spectral resolution with comparatively fewer sets of data than required to reconstruct an entire frequency field of view.

7. The method as defined in claim 4, wherein phase-separation is applied before or after the complex weighted recombination of the datasets.

8. The method as defined in claim 1, further comprising the step of generating a map of relaxation rates.

9. The method as defined in claim 1, wherein the integral of the magnetic gradient fields is chosen to be non-zero and the method is applied for spatial resolution.

10. The method as defined in claim 7, wherein the frequency sensitivity of the sequence is used for spatial resolution.

11. The method as defined in claim 1, wherein the signals from spectrally overlapping nuclei are separated by exploiting differing relaxation rates of said nuclei.

12. A magnetic resonance imaging system comprising:
  a) means for applying, to an object in a magnetic field, a sequence of radio frequency (RF) pulses chosen such that the effect of said sequence on a spin ensemble of said object being characterized by a flip function $\omega_{\alpha\beta}(t)$, said flip function being represented as a Fourier series of frequency components $$\omega_{\alpha\beta}(t) = \sum_{j=-(m-1)/2}^{(m-1)/2} \omega_j e^{\left(i\frac{2\pi}{T_S}jt\right)}$$

wherein j is an integer running index, m is an integer denoting the number of frequency components of said Fourier series, i is the imaginary unit, t is time, $T_s$ is the periodicity of said flip function and $\omega_j$ is the rotation rate associated with the j-th frequency component, the pulses being chosen such that each one of said rotation rates $\omega_j$ is constrained not to exceed an upper limit given substantially by $$\omega_{\max} = \frac{2}{\sqrt{T_1 T_2}}$$

wherein T1 and T2 are the longitudinal and transversal relaxation time, respectively, of said ensemble;

b) mean for applying magnetic gradient fields to encode spatial position along at least one spatial dimension;
  c) mean for recording NMR signal during a signal recording time between excitation pulses.

13. A computer readable medium storing computer executable instructions for controlling a computer system of a magnetic resonance (NMR) imaging system including:
  a) computer executable instructions for applying, to an object in a magnetic field, a sequence of radio frequency (RF) excitation pulses, the effect of said sequence on a spin ensemble of said object being characterized by a flip function $\omega_{\alpha\beta}(t)$, said flip function being represented as a Fourier series of frequency components $$\omega_{\alpha\beta}(t) = \sum_{j=-(m-1)/2}^{(m-1)/2} \omega_j e^{\left(i\frac{2\pi}{T_S}jt\right)}$$

wherein j is an integer running index, m is an integer denoting the number of frequency components of said Fourier series, i is the imaginary unit, t is time, $T_s$ is the periodicity of said flip function and $\omega_j$ is the rotation rate associated with the j-th frequency component, the pulses being chosen such that each one of said rotation rates $\omega_j$ is constrained not to exceed an upper limit given substantially by $$\omega_{\max} = \frac{2}{\sqrt{T_1 T_2}}$$

wherein T1 and T2 are the longitudinal and transversal relaxation time, respectively, of said ensemble;
  b) computer executable instructions for applying magnetic gradient fields to encode spatial position along at least one spatial dimension;
  c) computer executable instructions for recording NMR signal during a signal recording time between excitation pulses.

* * * * *